(12) United States Patent
Taka et al.

(10) Patent No.: US 10,559,459 B2
(45) Date of Patent: Feb. 11, 2020

(54) METHOD FOR PRODUCING SILICON NITRIDE FILM AND SILICON NITRIDE FILM

(71) Applicants: TAIYO NIPPON SANSO CORPORATION, Tokyo (JP); SPP TECHNOLOGIES CO., LTD., Tokyo (JP)

(72) Inventors: Hiroshi Taka, Kawasaki (JP); Masaya Yamawaki, Kai (JP); Shoichi Murakami, Amagasaki (JP); Masayasu Hatashita, Amagasaki (JP)

(73) Assignees: TAIYO NIPPON SANSO CORPORATION, Tokyo (JP); SPP TECHNOLOGIES CO., LTD., Tokyo (JP)

( * ) Notice: Subject to any disclaimer, the term of this patent is extended or adjusted under 35 U.S.C. 154(b) by 0 days.

(21) Appl. No.: 16/082,619

(22) PCT Filed: Mar. 11, 2016

(86) PCT No.: PCT/JP2016/057781
§ 371 (c)(1),
(2) Date: Sep. 6, 2018

(87) PCT Pub. No.: WO2017/154202
PCT Pub. Date: Sep. 14, 2017

(65) Prior Publication Data
US 2019/0088465 A1    Mar. 21, 2019

(51) Int. Cl.
*H01L 21/469* (2006.01)
*H01L 21/02* (2006.01)
(Continued)

(52) U.S. Cl.
CPC .......... *H01L 21/0217* (2013.01); *C23C 16/34* (2013.01); *C23C 16/345* (2013.01);
(Continued)

(58) Field of Classification Search
CPC ........... H01L 21/0217; H01L 21/02274; H01L 21/31; H01L 21/324; H01L 21/3211;
(Continued)

(56) References Cited

U.S. PATENT DOCUMENTS

| 5,508,067 A * | 4/1996 | Sato ........................ C23C 16/30 |
| | | 427/579 |
| 8,771,807 B2 * | 7/2014 | Xiao ....................... C07F 7/025 |
| | | 427/578 |

(Continued)

FOREIGN PATENT DOCUMENTS

| JP | 06-132284 | 5/1994 |
| JP | 07-221026 | 8/1995 |

(Continued)

OTHER PUBLICATIONS

International Search Report in PCT Application No. PCT/JP2016/057781 dated Jun. 14, 2016 (4 pages).
(Continued)

*Primary Examiner* — Vu A Vu
(74) *Attorney, Agent, or Firm* — Nixon & Vanderhye P.C.

(57) ABSTRACT

One object of the present invention is to provide a method for producing a silicon nitride film having a high hydrofluoric acid resistance, a high moisture resistance and an appropriate internal stress on a substrate of which the temperature is controlled at 250° C. or lower, the present invention provides a method for producing a silicon nitride film (30) by a plasma chemical vapor deposition method, wherein a processing gas obtained by adding a hydrogen reducing gas in a range of 200 to 2000 volumetric flow rate
(Continued)

to an organosilane gas of 1 volumetric flow rate is used, a pressure in a process chamber (40) accommodating the substrate (20) is adjusted to be in a range of 35 to 400 Pa, and a density of high-frequency electric power applied to an electrode installed in the process chamber (40) is adjusted to be in a range of 0.2 to 3.5 W/cm$^2$.

10 Claims, 6 Drawing Sheets

(51) Int. Cl.
    *C23C 16/505* (2006.01)
    *C23C 16/455* (2006.01)
    *C23C 16/34* (2006.01)
    *H01L 21/31* (2006.01)
    *C23C 16/50* (2006.01)

(52) U.S. Cl.
    CPC ........ *C23C 16/45502* (2013.01); *C23C 16/50* (2013.01); *C23C 16/505* (2013.01); *H01L 21/02274* (2013.01); *H01L 21/31* (2013.01)

(58) Field of Classification Search
    CPC ............. H01L 21/0262; H01L 21/0254; H01L 21/02315; H01L 21/02216; C23C 16/50; C23C 16/345; C23C 16/34
    USPC ........................................................ 438/793
    See application file for complete search history.

(56) References Cited

U.S. PATENT DOCUMENTS

| | | | |
|---|---|---|---|
| 2010/0140683 | A1 | 6/2010 | Miyazaki et al. |
| 2011/0014795 | A1 | 1/2011 | Lee et al. |
| 2014/0220711 | A1 | 8/2014 | Murakami et al. |
| 2015/0099375 | A1 | 4/2015 | Haripin et al. |

FOREIGN PATENT DOCUMENTS

| | | |
|---|---|---|
| JP | 09-186153 | 7/1997 |
| JP | 2004-507108 | 3/2004 |
| JP | 2006-303431 | 11/2006 |
| JP | 4048112 | 2/2008 |
| JP | 2010-103484 | 5/2010 |
| JP | 2011-089186 | 5/2011 |
| JP | 2012-160647 | 8/2012 |
| JP | 2012-188735 | 10/2012 |
| JP | 2013-038354 | 2/2013 |
| JP | 5269093 | 5/2013 |
| JP | 2013-153164 | 8/2013 |
| JP | 2015-73099 | 4/2015 |
| JP | 2016-082010 | 5/2016 |
| TW | 201247690 | 12/2012 |
| TW | 201341569 | 10/2013 |
| TW | 201413043 | 4/2014 |
| WO | 02/17374 | 2/2002 |
| WO | 2004/066377 | 8/2004 |
| WO | 2015/079938 | 6/2015 |

OTHER PUBLICATIONS

Office action with translation in JP Application No. 2014-210316 dated Aug. 1, 2017 (5 pages).
Office Action issued in TW Appl. No. 105107525 dated Jul. 18, 2019 w/ translation.
Search Report issued in EP Appln. No. 16893529.4 dated Nov. 13, 2019.
Minamikawa et al., "Formation of highly moisture-resistive SiN$_x$ films on Si substrate by Cat-CVD at room temperature" *Thin Solid Films*, vol. 501: 154-156 (2006).
Taka et al., "Development of High-quality Low-temperature (<120°C) PECVD-SiN Films by Organosilane" *IEEE 2015 International 3D Systems Integration Conference*, 3DIC, pp. TS8.2.1-TS8.2.4 (2015).

\* cited by examiner

METHOD FOR PRODUCING SILICON NITRIDE FILM AND SILICON NITRIDE FILM

This application is the U.S. national phase of International Application No. PCT/JP2016/057781 filed Mar. 11, 2016 which designated the U.S., the entire contents of which are hereby incorporated by reference.

FIELD OF THE INVENTION

The present invention relates to a method for producing a silicon nitride film and a silicon nitride film.

DESCRIPTION OF RELATED ART

Since a silicon nitride film is excellent in chemical stability, the silicon nitride film has been used as a mask material in a producing process of a semiconductor device such as an electronic device and an optical device, a metal diffusion preventing film, an oxidation barrier film, a passivation film, an insulating film and the like in a semiconductor device.

As a method for producing the silicon nitride film on a substrate, a thermal chemical vapor deposition method (thermal CVD method) in which a mixed gas of silane chloride and ammonia is supplied onto the substrate heated to 700° C. or higher to form the silicon nitride film, a plasma chemical vapor deposition method (plasma CVD method) in which active species obtained by exciting a mixed gas of silane and ammonia with plasma are supplied onto the substrate heated to 350° C. or higher to form the silicon nitride film, and the like have been widely used.

In recent years, along with miniaturization and high integration of semiconductor devices and expansion of applications of the silicon nitride film itself, substrates and underlying layers for producing a silicon nitride film have diversified, and underlying layers having low thermal resistance are increasing. Therefore, it is desired to produce a silicon nitride film by a plasma CVD method at 300° C. or lower, and preferably at 250° C. or lower.

In general, however, it is difficult to control the composition of atoms constituting the silicon nitride film and the bonding state between atoms when the film formation temperature is lowered. For this reason, it is well known that the film structure becomes coarse as compared with the case where the plasma CVD method is performed at a substrate temperature of more than 350° C., and the bonding between silicon atoms and hydrogen atoms, and the bonding between nitrogen atoms and hydrogen atoms increase, chemical stability is decreased.

On the other hand, when another thin film is formed on the silicon nitride film used for an insulating layer or the like, there is a possibility that contaminants such as organic substances, particles, and so on, may adhere to the surface of the silicon nitride layer. Therefore, prior to producing the thin film, a cleaning process may be performed to immerse the surface of the silicon nitride layer in a cleaning liquid such as diluted hydrofluoric acid to remove contaminants. For this process, when the silicon nitride film is scraped off in the cleaning process, the predetermined function cannot be exerted, so that a high hydrofluoric acid resistance is required for the silicon nitride film.

Likewise, even when the silicon nitride film is used as an etching stopper layer in an etching process for producing a device, the silicon nitride film is required to have high hydrofluoric acid resistance. Therefore, if the chemical stability of the silicon nitride film is lowered due to the above-mentioned reasons, there is a possibility that the function as the metal diffusion preventing film, the oxidation barrier film, the passivation film, the insulating film and the like cannot be fulfilled.

In response to such problems, Patent Document 1 discloses a method for producing a silicon nitride film having a wet etching rate to a hydrofluoric acid solution (1% HF aqueous solution) of less than 50 nm/min by a high-density plasma CVD apparatus. However, the substrate temperature is about 450° C., which is insufficient for the above-mentioned requirement of 250° C. or lower. This means that it is difficult to produce a silicon nitride film having high hydrofluoric acid resistance.

In addition, Patent Document 2 discloses a plasma CVD method using an organosilazane compound as a method for producing a SiNCH film having a hydrofluoric acid resistance and a low leakage current value (high insulating property) at a substrate temperature of 200° C. to 400° C. However, quantitative numerical values of hydrofluoric acid resistance and insulating properties are not disclosed. In addition, the moisture resistance required for the oxidation barrier film and the passivation film is not discussed.

Further, Patent Document 3 discloses a plasma CVD method for producing a silicon nitride film effective for a passivation film at 200° C. or lower. However, the film property being discussed is the gas permeability only, and the hydrofluoric acid resistance which is indispensable for producing the device is not discussed.

Meanwhile, in order to utilize the silicon nitride film as a thin film constituting a semiconductor device, it is also necessary to produce the silicon nitride film having a small internal stress for the purpose of preventing deformation of the substrate and film peeling. Patent Document 4 discloses a method for producing a silicon nitride film, and examples in which the internal stress of the silicon nitride film produced in a range of 25° C. to 250° C. is in a range of −200 MPa to 200 MPa. However, there is no disclosure of film properties other than the internal stress.

Patent Document 5 discloses a technique capable of controlling the film stress of the silicon nitride film formed on the substrate of 100° C. or lower in a range of −400 to +100 MPa by controlling the hydrogen gas flow rate and the microwave output in the plasma CVD method using silane or disilane. However, there is no disclosure of the influence on the moisture resistance or the insulation at all.

PRIOR ART DOCUMENTS

Patent Literature

Patent Document 1: Japanese Patent No. 5269093
Patent Document 2: Japanese Patent No. 4048112
Patent Document 3: Japanese Unexamined Patent Application, First Publication No. 2011-89186
Patent Document 4: Japanese Unexamined Patent Application, First Publication No. H09-186153
Patent Document 5: Japanese Unexamined Patent Application, Publication No. 2012-188735

DISCLOSURE OF THE INVENTION

Problem to be Solved by the Invention

Meanwhile, a recent demand for producing a silicon nitride film by a plasma CVD method is that a film, which has a wet etching rate lower and a moisture resistance equal to or higher than those of a conventional silicon nitride film produced at a substrate temperature of 350° C. or higher, is formed on a substrate controlled to be at a temperature of 250° C. or lower. At the same time, it is also demanded that the internal stress in the film is able to be arbitrarily controlled.

However, there is a problem in lowering the substrate temperature in that it leads to deterioration of various properties such as high hydrofluoric acid resistance, high barrier properties, adjustment to an appropriate internal stress, high insulation and the like, which are required for a thin film constituting a semiconductor device or the like.

As described above, improvement in film properties has been attempted by adjusting the film forming conditions. However, since the influence on each film property is different for each condition factor, there is no established method for producing a silicon nitride film having multiple improved film properties at the same time.

The present invention has been made in view of the above circumstances, and it is an object of the present invention to provide a method for producing a silicon nitride film having a high hydrofluoric acid resistance, a high moisture resistance and an appropriate internal stress according to a demand of the device at a film formation temperature of 250° C. or lower, and the silicon nitride film.

Means for Solving the Problem

Generally, it is known that when hydrogen atoms are present in a large amount in the silicon nitride film, that is, when there are many Si—H bonds or N—H bonds, for example, the hydrofluoric acid resistance and the moisture resistance deteriorate. Particularly, in the case of the plasma CVD method, a large amount of hydrogen atoms is liberated along with dissociation of interatomic bonds in the raw material gas and incorporated into the film, so that it is difficult to produce a film having high quality. As a countermeasure, it is known that the hydrofluoric acid resistance can be improved by using a carbon-containing raw material gas to add carbon atoms into the silicon nitride film. On the other hand, it is also known that the insulation deteriorates due to the above measures.

The inventors of the present invention have conducted intensive studies to solve these conflicting problems and have reached the present invention. That is, the inventors of the present invention invented a method for simultaneously improving the hydrofluoric acid resistance and moisture resistance while suppressing the amount of carbon added to the silicon nitride film. Specifically, the inventors of the present invention have found that a method for achieving compatibility between a technique of exhausting either or both excessive carbon atoms and hydrogen atoms in the plasma space as they are, and a technique of incorporating an appropriate amount of carbon atoms with a low conductivity coupled state into a film by appropriately adjusting a plurality of silicon nitride film producing condition factors.

Although the structure itself of the silicon nitride film has not been elucidated, the present inventors have found that a silicon nitride film, which has a wet etching rate lower and a moisture resistance equal to or higher than those of a conventional silicon nitride film produced at a substrate temperature of 350° C. or higher and an appropriate internal stress, can be obtained by the method above. Specifically, the inventors of the present invention have found that according to the above method, a silicon nitride film in which (a) an etching rate by a hydrofluoric acid solution is 10 nm/min or lower, (b) a formation rate of a silicon oxide while being exposed to a saturated water vapor atmosphere at 208 kPa and 121° C. is 2 nm/hour or lower in terms of a silicon oxide film, and (c) an internal stress in the film is in the range of −1000 to 1000 MPa can be obtained by the method above.

In other words, the present invention provides the following methods for producing a silicon nitride film and silicon nitride films according to (1) to (8).

(1) A method for producing a silicon nitride film having the following film properties (a) to (c) on a substrate having a temperature of 250° C. or lower by using an organosilane gas as a raw material gas by a plasma chemical vapor deposition method, wherein a processing gas obtained by adding a hydrogen reducing gas in a range of 200 to 2000 volumetric flow rate to an organosilane gas of 1 volumetric flow rate is used, a pressure in a process chamber accommodating the substrate is adjusted to be in a range of 35 to 400 Pa, and a density of high-frequency electric power applied to an electrode installed in the process chamber is adjusted to be in a range of 0.2 to 3.5 W/cm$^2$, (a) an etching rate by a hydrofluoric acid solution is 10 nm/min or lower, (b) a formation rate of a silicon oxide while being exposed to a saturated water vapor atmosphere at 208 kPa and 121° C. is 2 nm/hour or lower in terms of a silicon oxide film, and (c) an internal stress in the film is in the range of −1000 to 1000 MPa.

In the production method above, it is preferable to adjust a linear velocity of the processing gas introduced into the process chamber to be in a range of 0.3 to 5.0 cm/sec.

The above "linear velocity" means a value calculated by:

total flow rate of supply gas/plasma generation area×
(atmospheric pressure/processing pressure).

In addition, "plasma generation area" above means an area of an electrode for plasma generation.

(2) The method for producing a silicon nitride film according to (1), wherein a linear velocity of the processing gas introduced into the process chamber is adjusted to be in a range of 0.3 to 5.0 cm/sec.

(3) The method for producing a silicon nitride film according to (1) or (2), wherein the organosilane gas is represented by a formula $(R^1R^2N)_n SiH_{4-n}$, (wherein $R^1$ and $R^2$ are each independently a hydrocarbon group and n is any one of 2, 3 and 4).

(4) The method for producing a silicon nitride film according to (3), wherein the hydrocarbon group is a methyl group or an ethyl group.

(5) The method for producing a silicon nitride film according to (1), wherein the organosilane gas contains at least one selected from the group consisting of tetrakis(dimethylamino)silane, tris(dimethylamino)silane, bis(dimethylamino)silane, tetrakis(diethylamino)silane, tris(diethylamino)silane, bis(diethylamino)silane, tetrakis(ethylmethylamino)silane, tris(ethylmethylamino)silane, and bis(ethylmethylamino)silane.

(6) The method for producing a silicon nitride film according to any one of (1) to (5), wherein the hydrogen reducing gas includes a hydrogen atom.

(7) The method for producing a silicon nitride film according to (6), wherein the hydrogen reducing gas contains at least one selected from the group consisting of ammonia, amine, and hydrocarbon.

(8) A silicon nitride film having following film properties (a) to (c) which is produced by a plasma chemical vapor deposition method, wherein an organosilane gas is used as a raw material gas, a film formation temperature is adjusted to 250° C. or lower, a processing gas obtained by adding a hydrogen reducing gas in a range of 200 to 2000 volumetric flow rate with respect to the organosilane gas of 1 volumetric flow rate is used, a pressure in a process chamber accommodating a substrate is adjusted to be in a range of 35 to 400 Pa, and a density of high-frequency electric power applied to an electrode installed in the process chamber is adjusted to be in a range of 0.2 to 3.5 W/cm$^2$, (a) an etching rate by a hydrofluoric acid solution is 10 nm/min or lower,
(b) a formation rate of a silicon oxide while being exposed to a saturated water vapor atmosphere at 208 kPa and 121° C. is 2 nm/hour or lower in terms of a silicon oxide film, and
(c) an internal stress in the film is in a range of −1000 to 1000 MPa.

Effects of the Invention

In the method for producing a silicon nitride film according to the present invention, when the silicon nitride film is produced by a plasma chemical vapor deposition method using an organosilane gas as a raw material gas and adjusting a film formation temperature to 250° C. or lower, a processing gas obtained by adding a hydrogen reducing gas in a range of 200 to 2000 volumetric flow rate with respect to the organosilane gas of 1 volumetric flow rate is used, the pressure in a process chamber accommodating a substrate is adjusted to be in a range of 35 to 400 Pa, and the density of high-frequency electric power applied to an electrode installed in the process chamber is adjusted to be in a range of 0.2 to 3.5 W/cm$^2$.

As a result, it is possible to produce a silicon nitride film having a high hydrofluoric acid resistance, a high moisture resistance and an appropriate internal stress according to the demands of the device side.

The silicon nitride film according to the present invention is a film which is produced by a plasma chemical vapor deposition method, wherein an organosilane gas is used as a raw material gas, a film formation temperature is adjusted to 250° C. or lower, a processing gas obtained by adding a hydrogen reducing gas in a range of 200 to 2000 volumetric flow rate with respect to the organosilane gas of 1 volumetric flow rate is used, the pressure in a process chamber accommodating a substrate is adjusted to be in a range of 35 to 400 Pa, and the density of high-frequency electric power applied to an electrode installed in the process chamber is adjusted to be in a range of 0.2 to 3.5 W/cm$^2$.

As a result, the silicon nitride film has a high hydrofluoric acid resistance, a high moisture resistance and an appropriate internal stress according to the demands of the device side.

DETAILED DESCRIPTION OF THE INVENTION

Figure 1:
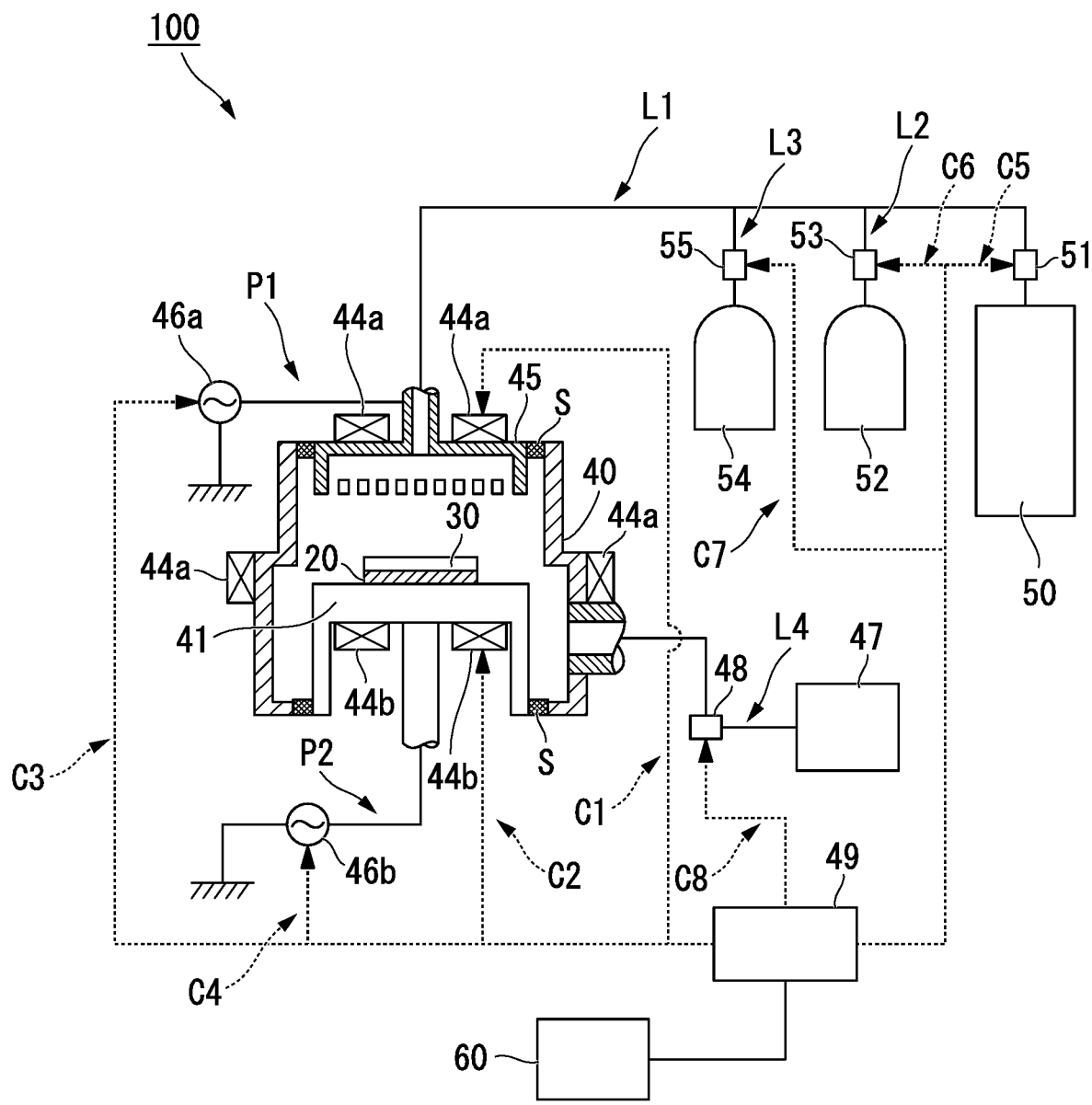
FIG. 1 is a diagram showing an example of a plasma CVD apparatus used in a method for producing a silicon nitride film which is one embodiment according to the present invention.

Hereinafter, one embodiment of the method for producing a silicon nitride film according to the present invention will be described in detail with reference to the drawings. In the drawings used in the following description, in order to make the features easy to understand, there are cases where characteristic portions are enlarged for the sake of convenience, and the dimensional ratios and the like of each component are not always the same as the actual ones.

<Apparatus for Producing Silicon Nitride Film>

First, the configuration of an apparatus for producing a silicon nitride film which can be used in one embodiment of the method for producing a silicon nitride film according to the present invention will be described. That is, an example of a configuration of a plasma chemical vapor deposition apparatus (plasma CVD apparatus) used in the method for producing a silicon nitride film according to this embodiment will be described.

FIG. 1 is a diagram showing an example of a plasma CVD apparatus used in a method for producing a silicon nitride film which is one embodiment of the present invention.

As shown in FIG. 1, a plasma CVD apparatus 100 mainly includes a substrate 20, a process chamber 40, a stage 41, heaters 44a, 44b, a showerhead gas introduction part 45, electric power sources 46a, 46b, a vacuum pump 47, an exhaust flow rate regulator 48, a control unit 49, an organosilane gas supply source 50, a first hydrogen reducing gas supply source 52, a second hydrogen reducing gas supply source 54, gas flow rate regulators 51, 53, 55, a computer 60, and an insulation part S.

The substrate 20 is provided on the stage 41, and a silicon nitride film 30 is produced on the substrate 20. The material of the substrate 20 is not particularly limited as long as it has heat resistance at a film formation temperature of 250° C. Specifically, for example, quartz or the like can be used.

The process chamber 40 accommodates the substrate 20, and includes the stage 41, the heaters 44a, 44b, and the showerhead gas introduction part 45. An organosilane gas is supplied from the organosilane gas supply source 50 into the process chamber 40, and hydrogen reducing gas is supplied from the first hydrogen reducing gas supply source 52 and the second hydrogen reducing gas supply source 54 into the process chamber 40 to produce the silicon nitride film 30.

The stage 41 is provided near the center of the process chamber 40.

The heater 44a is provided on the upper portion of the showerhead gas introduction portion 45 and the side surface of the process chamber 40, and the heater 44b is provided on the underside of the stage 41 so that the temperature in the process chamber 40 and the substrate 20 can be adjusted. The upper limit of the substrate temperature is not particularly limited, but preferably 250° C. or lower from the background of the demand for low temperature film formation.

The showerhead gas introduction part 45 is provided upper portion of the process chamber 40. The organosilane gas and the hydrogen reducing gas are introduced into the process chamber 40 via the showerhead gas introduction part 45.

The electric power source 46a is connected to the showerhead gas introduction part 45 via the electric power supply wire P1. On the other hand, the electric power source 46b is connected to the stage 41 via the electric power supply wire P2. By applying electric power with a predetermined frequency to the showerhead gas introduction part 45 from the electric power source 46a, a mixed gas of organosilane gas and a hydrogen reducing gas which are discharged from the showerhead gas introduction part 45 can be converted into plasma. Electric power with a predetermined frequency is applied to the stage 41 from the electric power source 46b as necessary, and the generated plasma is supplied to the substrate 20 on the stage 41. The silicon nitride film 30 is produced on the substrate 20 exposed to the plasma. The electric power sources 46a and 46b are not particularly limited, but specifically, for example, high-frequency electric power source or the like can be used. It is also possible to use multiple electric power sources at the same time.

The vacuum pump 47 is connected to the process chamber 40 via an exhaust line L4. The vacuum pump 47 can reduce the pressure in the process chamber 40 and exhaust the gas generated after the silicon nitride film 30 is produced.

The exhaust flow rate regulator 48 is provided in the exhaust line L4, and can adjust the exhaust flow rate of the gas exhausted by the vacuum pump 47. The exhaust flow rate regulator 48 is not particularly limited, but it may be controlled manually or automatically by an external control device.

The control unit 49 is connected to the heater 44a via the signal line C1, the heater 44b via the signal line C2, the electric power source 46a via the signal line C3, the electric power source 46b via the signal line C4, the gas flow rate regulator 51 via the signal line C5, the gas flow rate regulator 53 via the signal line C6, the gas flow rate regulator 55 via the signal line C7, and the exhaust flow rate regulator 48 via the signal line C8. The control unit 49 can control the heaters 44a, 44b, the electric power sources 46a, 46b, the gas flow rate regulators 51, 53, 55, and the exhaust flow rate regulator 48. The control unit 49 is connected to the computer 60.

The organosilane gas supply source 50 is connected to the showerhead gas introduction part 45 provided in the process chamber 40 via the gas supply line L1, and can supply the organosilane gas into the process chamber 40. The organosilane gas supply source 50 is not particularly limited. Specifically, for example, a cylinder filled with an organosilane gas or the like can be used.

In addition, the organosilane gas is not particularly limited, but examples thereof include tetrakis(dimethylamino) silane, tris(dimethylamino)silane, bis(dimethylamino)silane, tetrakis(diethylamino)silane, tris(diethylamino)silane, bis(diethylamino)silane, tetrakis(ethylmethylamino)silane, tris(ethylmethylamino)silane, bis(ethylmethylamino)silane, and the like.

The first hydrogen reducing gas supply source 52 is connected to the showerhead gas introduction unit 45 provided in the process chamber 40 via a first hydrogen reducing gas supply line L2 and a gas supply line L1, and supplies hydrogen reducing gas into the process chamber 40. The first hydrogen reducing gas supply source 52 is not particularly limited, but specifically, for example, a cylinder filled with the hydrogen reducing gas supply source or the like can be used.

In addition, the hydrogen reducing gas is not particularly limited, but specifically, for example, hydrogen gas ($H_2$), ammonia gas ($NH_3$), amines, hydrocarbons and the like can be used.

The second hydrogen reducing gas supply source 54 is connected to the showerhead gas introduction part 45 provided in the process chamber 40 via a second hydrogen reducing gas supply line L3 and a gas supply line L1, and supplies hydrogen reducing gas into the process chamber 40. A mixture of two kinds of hydrogen reducing gases can be used by using the second hydrogen reducing gas supply source 54 in addition to the first hydrogen reducing gas supply source 52. The second hydrogen reducing gas supply source 54 is not particularly limited, but specifically, for example, a cylinder filled with a hydrogen reducing gas supply source or the like can be used.

The gas flow rate regulator 51 is provided on the primary side of the gas supply line L1 to a junction with the first hydrogen reducing gas supply line L2 and regulates the flow rate of the organosilane gas supplied from the organosilane gas supply source 50. Further, the gas flow rate regulator 53 is provided in the first hydrogen reducing gas supply line L2, and can adjust the flow rate of the hydrogen reducing gas supplied from the first hydrogen reducing gas supply source 52. Further, the gas flow rate regulator 55 is provided in the second hydrogen reducing gas supply line L3, and can regulate the flow rate of the hydrogen reducing gas supplied from the second hydrogen reducing gas supply source 54. The gas flow rate regulators 51, 53, and 55 are not particularly limited, but they may be controlled manually or automatically by an external control device.

The insulating portion S is provided between the showerhead gas introduction part 45 and the process chamber 40, and can electrically insulate between the showerhead gas introduction part 45 and the process chamber 40. Further, the insulating portion S is also provided between the stage 41 and the process chamber 40, so that the stage 41 and the process chamber 40 can be electrically insulated.

<Method for Producing Silicon Nitride Film>

Next, a method for producing a silicon nitride film of the present embodiment (hereinafter simply referred to as "production method") using the above-described plasma CVD apparatus 100 will be described.

The production method according to this embodiment is a method for producing a silicon nitride film having desired film properties by a plasma chemical vapor deposition method (Plasma CVD method) including an introduction step of introducing a processing gas into the process chamber 40 accommodating the substrate 20 under a predetermined gas introduction condition, a plasma exciting step of plasma exciting the processing gas by applying high-frequency electric power, and a silicon nitride forming step of forming a silicon nitride film 30 on the substrate 20 using plasma active species.

Specifically, the production method according to this embodiment is the plasma CVD method above, wherein an organosilane gas is used as a raw material gas, a film formation temperature is adjusted to 250° C. or lower, a processing gas obtained by adding a hydrogen reducing gas in a range of 200 to 2000 volumetric flow rate with respect to the organosilane gas of 1 volumetric flow rate is used, the pressure in the process chamber 40 is adjusted to be in a range of 35 to 400 Pa, and the density of high-frequency electric power applied to the showerhead gas introduction part 45 installed in the process chamber 40 is adjusted to be in a range of 0.2 to 3.5 W/cm².

The film properties evaluation methods will be described later.

Hereinafter, the production method of the present embodiment will be described in detail.

First, the substrate 20 is placed on the stage 41, and heated by the heater 44b until the substrate 20 reaches a predetermined temperature. The upper limit of the substrate temperature is not particularly limited, but it is preferable to set it at 250° C. or lower from the background of the demand for low temperature film formation.

Next, the organosilane gas supplied from the organosilane gas supply source 50 is diluted with a large amount of the hydrogen reducing gas supplied from the first hydrogen reducing gas supply source 52 and the second hydrogen reducing gas supply source 54, and then the gas diluted is supplied into the process chamber 40 via the supply line L1. By performing the dilution operation described above, in addition to the effect of reducing the amount of carbon atoms and hydrogen atoms incorporated into the film, an effect of not forming a C=C bond with low binding energy in the film is obtained.

Figure 2:
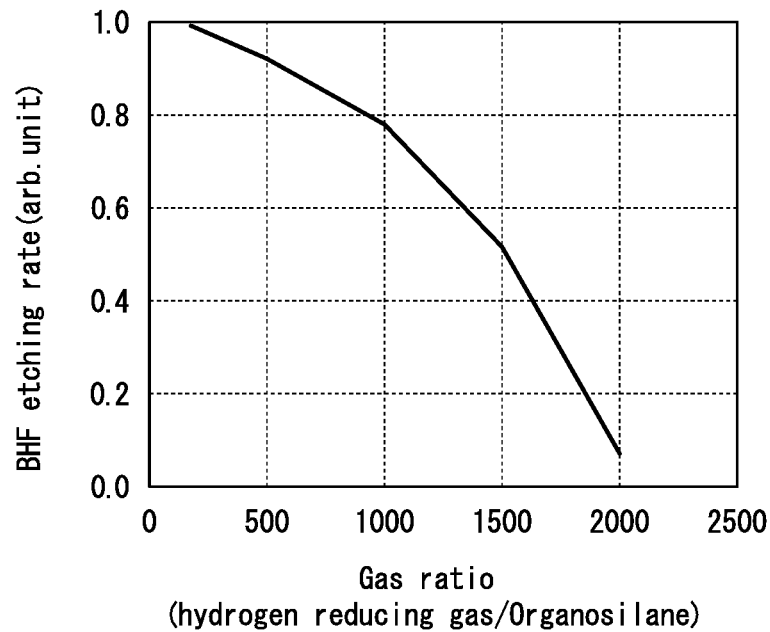
FIG. 2 is a graph showing a relationship between a gas ratio and a BHF etching rate.
Figure 3:
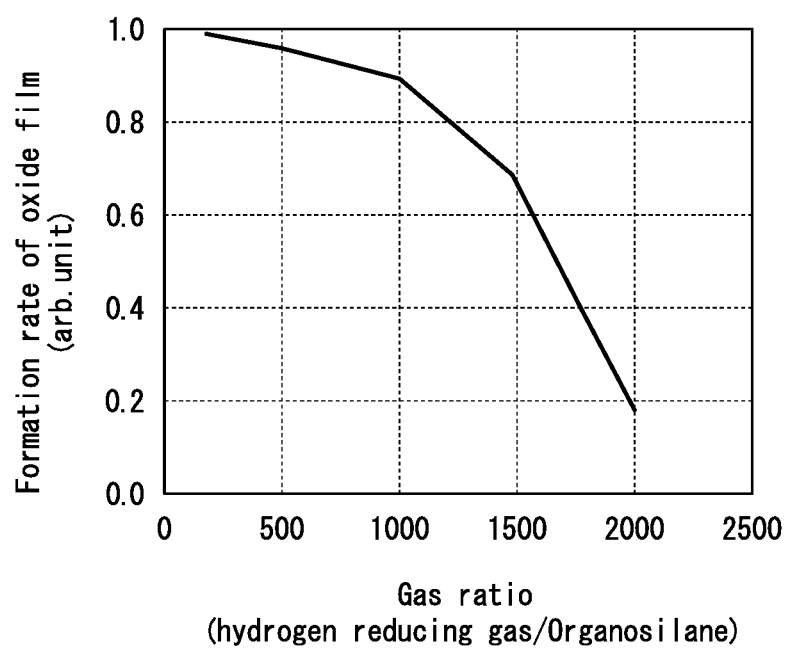
FIG. 3 is a graph showing a relationship between a gas ratio and a formation rate of an oxide film.
Figure 4:
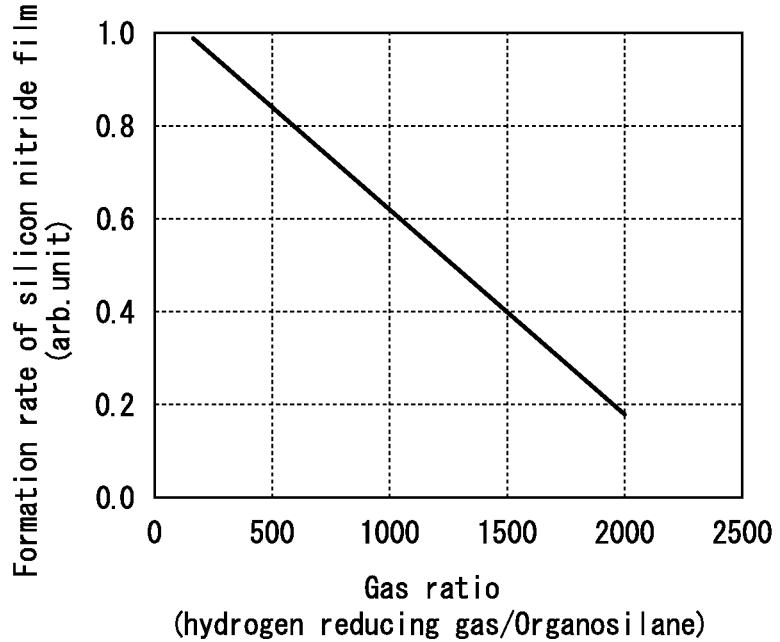
FIG. 4 is a graph showing a relationship between a gas ratio and a formation rate of a silicon nitride film.

Here, the results of examination by the present inventors on the relationship between the gas ratio of the hydrogen reducing gas with respect to the organosilane gas of 1 volumetric flow rate and the film properties are shown in FIGS. 2 to 4, respectively.

FIG. 2 is a graph showing the relationship between a gas ratio and a BHF etching rate. In FIG. 2, the horizontal axis represents the gas ratio of the hydrogen reducing gas with respect to the organosilane gas of 1 volumetric flow rate. On the other hand, the vertical axis represents the BHF etching rate, and the smaller the value, the higher the hydrofluoric acid resistance is.

It can be understood from FIG. 2 that in the production method of the present embodiment, increasing the gas ratio tends to improve hydrofluoric acid resistance. On the other hand, when the gas ratio is decreased, the hydrofluoric acid resistance tends to decrease.

FIG. 3 is a graph showing the relationship between a gas ratio and a formation rate of the oxide film. In FIG. 3, the horizontal axis represents the gas ratio of the hydrogen reducing gas with respect to the organosilane gas of 1 volumetric flow rate. On the other hand, the vertical axis represents the formation rate of the oxide film, and the smaller the value, the higher the moisture resistance is. Moreover, it should be noted that in the silicon nitride film of the present invention, generation of an oxide film proceeds from the surface side of the silicon nitride film, and moisture does not permeate to a depth deeper than the thickness of the generated oxide film has been confirmed separately by experiments. It can be understood from FIG. 3 that in the production method of this embodiment, increasing the gas ratio tends to improve moisture resistance. On the other hand, when the gas ratio is decreased, humidity resistance tends to decrease.

FIG. 4 is a graph showing the relationship between a gas ratio and a formation rate of the silicon nitride film. In FIG. 4, the horizontal axis represents the gas ratio of the hydrogen reducing gas with respect to the organosilane gas of 1 volumetric flow rate. On the other hand, the vertical axis represents the formation rate of the silicon nitride film, and the larger the value, the faster the formation rate of the silicon nitride film. It can be understood from FIG. 4 that in the production method of this embodiment, increasing the gas ratio tends to decrease the deposition rate of the silicon nitride film. On the other hand, when the gas ratio is decreased, the formation rate of the silicon nitride film tends to increase.

As a result of the above investigations, as the gas ratio of the hydrogen reducing gas with respect to the organosilane gas of 1 volumetric flow rate is increased, the hydrofluoric acid resistance and the moisture resistance are improved, whereas the formation rate decreases and the productivity decreases. Therefore, in the production method of this embodiment, it is preferable to use a processing gas to which hydrogen reducing gas in a range of 200 to 2000 volumetric flow rate is added to the organosilane gas of 1 volumetric flow rate.

The adjustment of the gas ratio is performed by adjusting the flow rate of each gas. Specifically, the flow rate of the organosilane gas is adjusted by the gas flow rate regulator 51, the flow rate of the hydrogen reducing gas supplied from the first hydrogen reducing gas supply source 52 is adjusted by the gas flow rate regulator 53, and the flow rate of the hydrogen reducing gas supplied from the second hydrogen reducing gas supply source 54 is adjusted by the gas flow rate regulator 55.

On the other hand, the internal pressure in the process chamber 40 to which the processing gas is supplied is controlled by the vacuum pump 47. The pressure in the process chamber 40 affects the residence time of the raw material gas in the process chamber 40 from the decomposition of the raw material gas in the plasma to the reaction on the substrate 20, the plasma discharge state, and the collision frequency. As a result, the pressure in the process chamber 40 also affects the film properties of the silicon nitride film to be produced. Specifically, as the pressure is lowered, the collision frequency decreases and the dissociation becomes insufficient. When the pressure is further lowered, the plasma state becomes unstable. On the other hand, as the pressure is increased, the mean free path becomes shorter and sufficient acceleration energy cannot be obtained, and further raising makes it difficult to maintain the plasma state.

Figure 5:
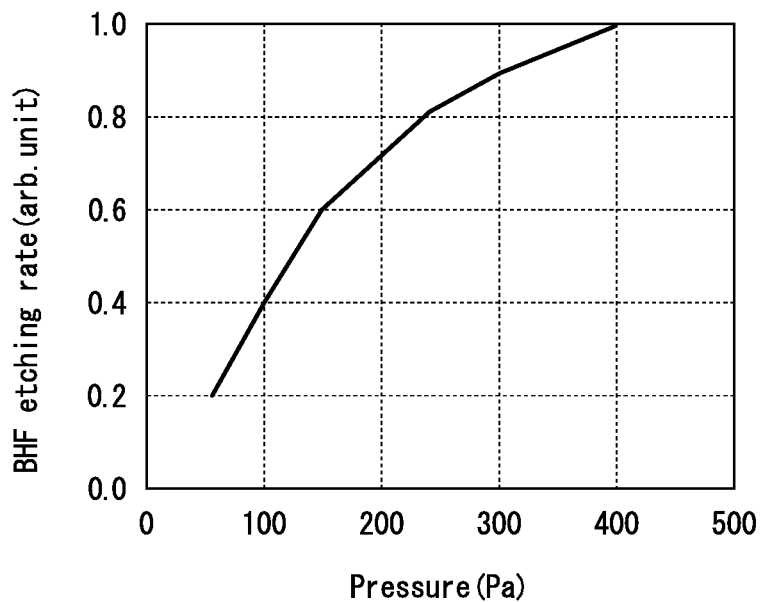
FIG. 5 is a graph showing a relationship between a pressure and a BHF etching rate.
Figure 6:
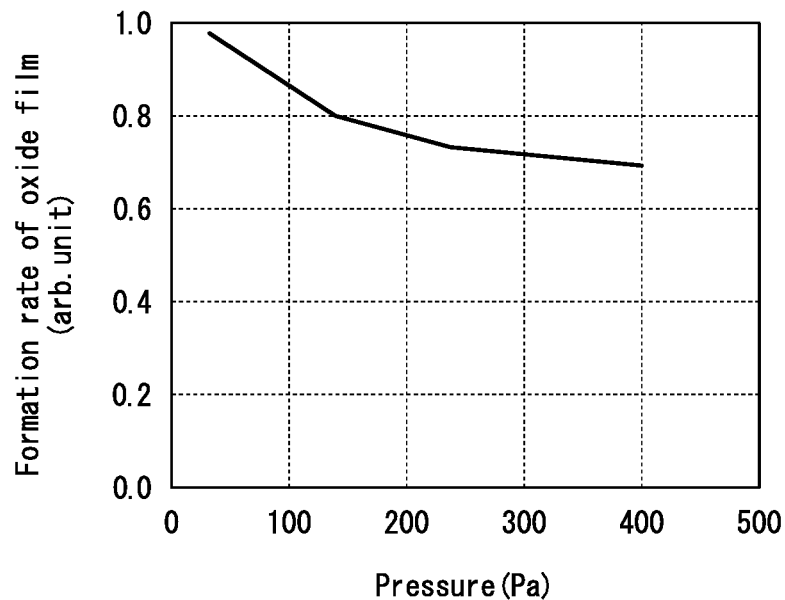
FIG. 6 is a graph showing a relationship between a pressure and a formation rate of an oxide film.

Here, the results of examination by the present inventors on the relationship between the pressure in the process chamber 40 and the film properties are shown in FIGS. 5 and 6, respectively.

FIG. 5 is a graph showing the relationship between the pressure and the BHF etching rate. In FIG. 5, the horizontal axis represents the pressure in the process chamber 40. On the other hand, the vertical axis represents the BHF etching rate, and the smaller the value, the higher the hydrofluoric acid resistance is. It can be understood from FIG. 5 that in the production method of this embodiment, increasing the pressure in the process chamber 40 tends to lower the hydrofluoric acid resistance. On the other hand, decreasing the pressure in the process chamber 40 tends to improve hydrofluoric acid tolerance.

FIG. 6 is a graph showing the relationship between a pressure and a formation rate of the oxide film. In FIG. 6, the horizontal axis represents the pressure in the process chamber 40. On the other hand, the vertical axis represents the formation rate of the oxide film, and the smaller the value, the higher the moisture resistance is. It can be understood from FIG. 6 that in the production method of the present embodiment, increasing the pressure in the process chamber 40 tends to improve the moisture resistance. On the other hand, when the pressure in the process chamber 40 is decreased, the moisture resistance tends to decrease.

From the results above, it can be understood that as the pressure in the process chamber 40 is increased, the moisture resistance improves, but on the other hand, the hydrofluoric acid resistance decreases. Therefore, in the production method of the present embodiment, it is preferable to adjust the pressure inside the process chamber 40 to be in a range of 35 to 400 Pa.

Further, the linear velocity of the processing gas supplied into the process chamber 40 is controlled by the gas flow rate regulators 51, 53, 55 and the pressure in the process chamber 40. Like the pressure in the process chamber 40, the linear velocity of the processing gas also affects the residence time of the raw material gas in the process chamber 40 from the decomposition of the raw material gas in the plasma to the reaction on the substrate 20, the state of plasma discharge and the frequency of collisions.

Figure 7:
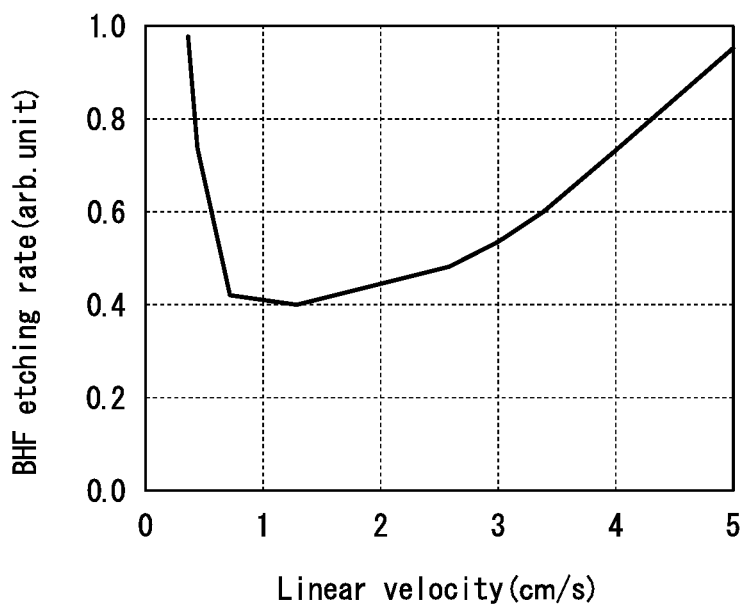
FIG. 7 is a graph showing a relationship between a linear velocity and a BHF etching rate.
Figure 8:
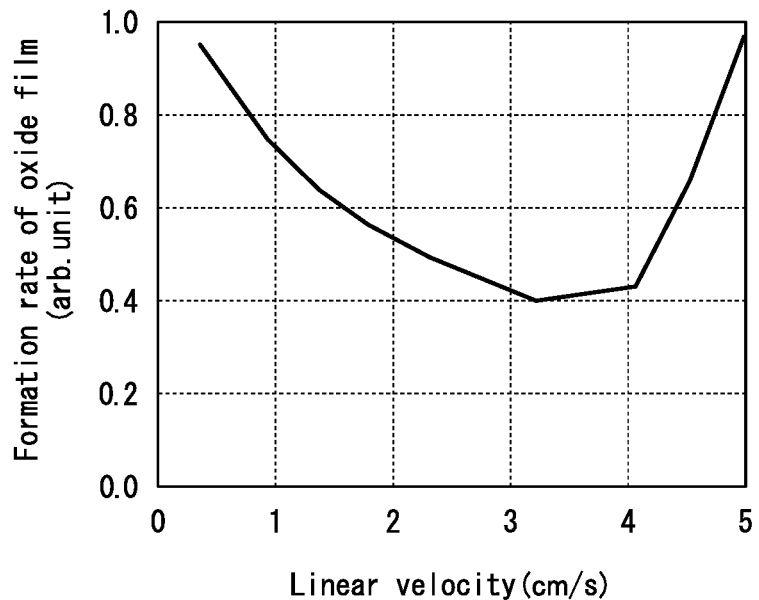
FIG. 8 is a graph showing a relationship between a linear velocity and a formation rate of an oxide film.

Here, the results of examination by the present inventors on the relationship between the linear velocity of the processing gas and the film properties are shown in FIGS. 7 and 8, respectively.

FIG. 7 is a graph showing the relationship between the linear velocity and the BHF etching rate. In FIG. 7, the horizontal axis represents the linear velocity of the processing gas. On the other hand, the vertical axis represents the BHF etching rate, and the smaller the value, the higher the hydrofluoric acid resistance is. It can be understood from FIG. 7 that in the production method of this embodiment, the BHF etching rate takes a minimum value when the linear velocity is around 1.0 cm/sec, and the hydrofluoric acid resistance is the highest.

FIG. 8 is a graph showing the relationship between a linear velocity and a formation rate of the oxide film. In FIG. 8, the horizontal axis represents the linear velocity of the processing gas. On the other hand, the vertical axis represents the formation rate of the oxide film, and the smaller the value, the higher the moisture resistance is. It can be understood from FIG. 8 that in the production method of this embodiment, the moisture resistance index takes a minimum value when the linear velocity is around 3.0 cm/sec, and the moisture resistance is the highest.

From the results above, it can be understood that the efficiency of generating active species in an appropriate dissociated state decrease, whether the linear velocity is too fast or too slow, so that a good quality film cannot be obtained. Therefore, in the production method of the present embodiment, it is preferable to adjust the linear velocity of the processing gas in a range of 0.3 to 5.0 cm/sec.

Next, the processing gas containing the organosilane gas and the hydrogen reducing gas supplied from the gas supply line L1 is excited by applying the electric power of a predetermined frequency to the showerhead gas introduction part 45 by the electric power source 46a.

In the production method of the present embodiment, the frequency of the applied electric power is not particularly limited, but it can be appropriately selected from a frequency of 60 MHz or lower. As an example, at least part of the effects of the present embodiment can be achieved by using either one or both of 380 kHz and 13.56 MHz simultaneously, and continuously or intermittently. The electric power applied affects the dissociation state of the organosilane gas and the hydrogen reducing gas.

Figure 9:
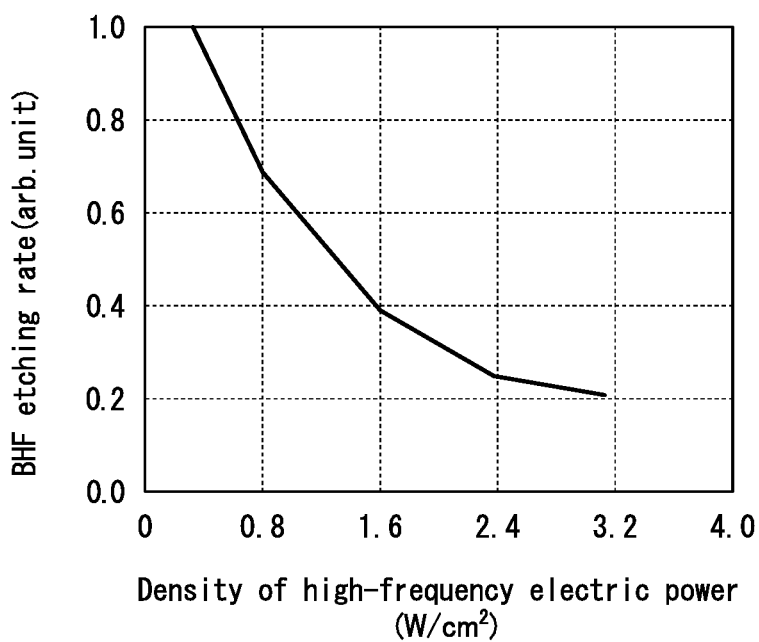
FIG. 9 is a graph showing a relationship between a density of high-frequency electric power and a BHF etching rate.
Figure 10:
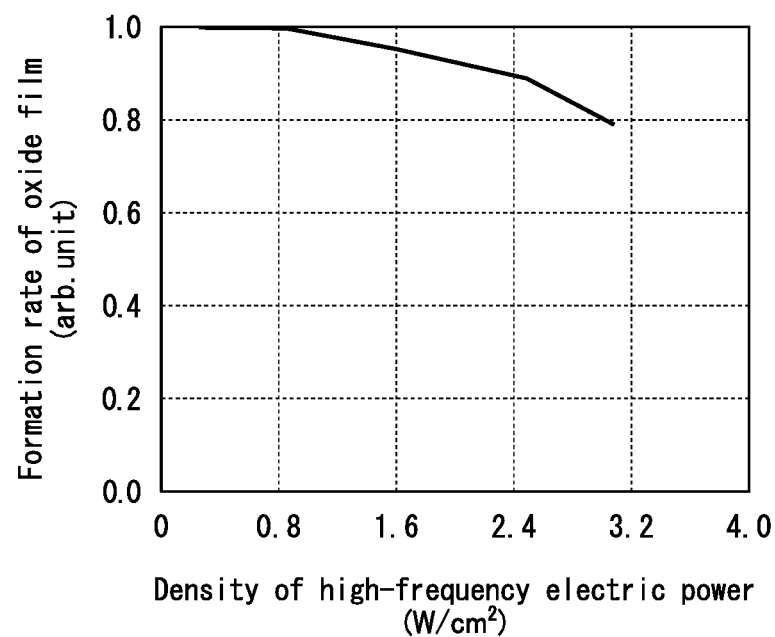
FIG. 10 is a graph showing a relationship between a density of high-frequency electric power and a formation rate of an oxide film.

Here, the results of examination by the present inventors on the relationship between the density of the high-frequency electric power and the film properties are shown in FIG. 9 and FIG. 10 respectively.

FIG. 9 is a graph showing the relationship between a density of the high-frequency electric power and the BHF etching rate. In FIG. 9, the horizontal axis represents the density of the high-frequency electric power. On the other hand, the vertical axis shows the BHF etching rate, and the smaller the value, the higher the hydrofluoric acid resistance is. It can be understood from FIG. 9 that in the production method of this embodiment, the hydrofluoric acid resistance tends to be improved when the density of the high-frequency electric power is increased. On the other hand, decreasing the density of the high-frequency electric power tends to lower the hydrofluoric acid resistance.

FIG. 10 is a graph showing the relationship between a density of the high-frequency electric power and a moisture resistance index. In FIG. 10, the horizontal axis represents the density of the high-frequency electric power. On the other hand, the vertical axis shows the formation rate of the oxide film, and the smaller the value, the higher the moisture resistance is. It can be understood from FIG. 10 that in the production method of the present embodiment, increasing the density of the high-frequency electric power tends to improve the moisture resistance. On the other hand, decreasing the density of the high-frequency electric power tends to lower the moisture resistance.

From the results above, it can be understood that as the density of the high-frequency electric power increases, the hydrofluoric acid resistance and moisture resistance are improved. However, on the other hand, in order to avoid inconveniences such as high-frequency electric power source initial investment, power consumption cost and durability of the members constituting the plasma generating device, the density of the high-frequency electric power is preferably 3.0 W/cm$^2$ or lower.

In addition, when the density of the high-frequency electric power is 0.4 W/cm$^2$ or more, the decomposition of the raw material is proceeded, and the formation rate is 1 nm/min or more, which is preferable from the viewpoint of productivity. When the density of the high-frequency electric power is 0.2 W/cm$^2$ or lower, it is difficult to decompose the raw material and form SiN, which is not preferable from the viewpoint of productivity.

When the density of the high-frequency electric power is 3.5 W/cm$^2$, the substrate may be damaged depending on the device, and the device performance is deteriorated.

Therefore, in consideration of the above effect and inconvenience, in the production method for a silicon nitride film of the present invention, it is preferable to adjust the density of the high-frequency electric power within the range of 0.4 to 3.0 W/cm$^2$.

Moreover, the density of the high-frequency electric power is a numerical value when the electrode area to be applied with high frequency is 452 cm$^2$. In order to make the density of the high-frequency electric power be 0.2 W/cm$^2$ or more, the high-frequency electric power may be 90 W or more. In order to make the density of the high-frequency electric power be 3.5 W/cm$^2$ or lower, the high-frequency electric power may be 1583 W or lower.

Finally, the silicon nitride film 30 is produced on the substrate 20 by supplying the plasma generated to the substrate 20. Although gas is generated after the silicon nitride film 30 is produced, the vacuum pump 47 exhausts the gas generated to the outside of the process chamber 40 via the exhaust line L4.

In this manner, the silicon nitride film having the following film properties can be produced.

<Silicon Nitride Film>

The silicon nitride film obtained by the production method of the present embodiment described above, that is, the silicon nitride film obtained by using the plasma CVD apparatus 100, and the organosilane gas as a raw material gas, adjusting the film formation temperature to 250° C. or lower, using the processing gas obtained by adding the hydrogen reducing gas in a range of 200 to 2000 volumetric flow rate with respect to the organosilane gas of 1 volumetric flow rate, adjusting the pressure inside the process chamber 40 within the range of 35 to 400 Pa, and the density of the high-frequency electric power applied to the electrode installed in the process chamber 40 within the range of 0.2 to 3.5 W/cm$^2$ has the film properties shown in the following (a) to (c):

(a) an etching rate by a hydrofluoric acid solution is 10 nm/min or lower;
(b) a formation rate of a silicon oxide while being exposed to a saturated water vapor atmosphere at 208 kPa and 121° C. is 2 nm/hour or lower in terms of a silicon oxide film; and
(c) an internal stress in the film is in the range of −1000 to 1000 MPa.

As explained above, the production method of the present embodiment is the plasma CVD method using the organosilane gas as a raw material gas, and adjusting the film formation temperature to 250° C. or lower, wherein the processing gas obtained by adding a hydrogen reducing gas in a range of 200 to 2000 volumetric flow rate with respect to the organosilane gas of 1 volumetric flow rate is used, the pressure in the process chamber accommodating the substrate is adjusted to be in a range of 35 to 400 Pa, and the electric power density of high frequency applied to the showerhead gas introduction part 45 installed in the process chamber 40 is adjusted to be in a range of 0.2 to 3.5 W/cm$^2$.

As a result, it is possible to produce a silicon nitride film having a high hydrofluoric acid resistance, a high moisture resistance and an appropriate internal stress (i.e., the film properties of the above (a) to (c)) according to the demands of the device side.

Moreover, according to the production method of this embodiment, it is preferable to adjust the linear velocity of the processing gas introduced into the process chamber within the range of 0.3 to 5.0 cm/sec.

In the following PCT results, the formation rate of the silicon oxide film of 2 nm/hour is equivalent to 0.2 g/m$^2$/day in the general moisture permeability evaluation method.

It should be noted that the technical scope of the present invention is not limited to the above embodiments, and various modifications can be made without departing from the spirit of the present invention. For example, although two types of hydrogen reducing gases are used by using the first hydrogen reducing gas supply source 52 and the second hydrogen reducing gas supply source 54 in the production method of the embodiment above, one hydrogen reducing gas supply source may be provided.

Examples

<Production of Silicon Nitride Film>

In Examples 1 to 8, a silicon nitride film was produced on a silicon substrate controlled at 250° C. or lower based on the production method for a silicon nitride film of the present invention.

Tris(dimethylamino)silane (3DMAS) or tetrakis(dimethylamino)silane (4DMAS) was used as the organosilane gas, and hydrogen gas (H$_2$) was used as the hydrogen reducing gas.

The frequency of the electric power applied was 380 kHz or 13.56 MHz.

Table 1 below shows production conditions such as the ratio of the flow rate of the hydrogen reducing gas to the flow rate of the organosilane gas, the linear velocity, the pressure in the process chamber, the electric power density and the like in each example.

In Comparative Examples 1 and 2, a silicon nitride film was produced on a silicon substrate controlled at 200° C. or 250° C. by using silane gas under optimal conditions from the viewpoint of film properties.

The production conditions of Comparative Examples 1 and 2 are shown in Table 1 below.

In Comparative Example 3, a silicon nitride film was produced on a silicon substrate of which the temperature was controlled at 350° C. by using a silane gas.

The producing conditions of Comparative Example 3 are shown in Table 1 below.

In Comparative Examples 4 and 5, a silicon nitride film was produced on a silicon substrate controlled at 200° C. by using tris(dimethylamino)silane (3DMAS) as the organosilane gas and hydrogen gas (H$_2$) as the hydrogen reducing gas.

TABLE 1

| | Temperature [° C.] | Gas Species (Organosilane (1)/ hydrogen reducing gas (2)) | Rate of Flow Rate ((2)/(1)) | Linear Velocity [cm/sec.] | Pressure inside Process Chamber [Pa] | Frequency of Electric Power Applied | Density of Electric Power Applied [W/cm$^2$] |
|---|---|---|---|---|---|---|---|
| Example 1 | 250 | 3DMAS/H2 | 1200 | 0.9 | 133 | 13.56 MHz | 0.8 |
| Example 2 | 200 | 3DMAS/H2 | 875 | 0.5 | 133 | 13.56 MHz | 2.5 |
| Example 3 | 200 | 3DMAS/H2 | 1000 | 1.8 | 50 | 13.56 MHz | 1.5 |
| Example 4 | 200 | 3DMAS/H2 | 420 | 1.2 | 80 | 380 kHz | 0.6 |
| Example 5 | 200 | 3DMAS/H2 | 420 | 0.8 | 120 | 380 kHz | 1 |
| Example 6 | 250 | 3DMAS/H2 | 565 | 0.5 | 133 | 13.56 MHz | 2.5 |
| Example 7 | 250 | 3DMAS/H2 | 420 | 1.2 | 80 | 380 kHz | 1 |
| Example 8 | 250 | 4DMAS/H2 | 420 | 2.7 | 35 | 13.56 MHz | 1.4 |
| Comparative Example 1 | 200 | SiH4/H2 | 4 | 1 | 200 | 13.56 MHz | 1.2 |
| Comparative Example 2 | 250 | SiH4/H2 | 4 | 1 | 200 | 13.56 MHz | 1.2 |
| Comparative Example 3 | 350 | SiH$_4$/NH$_3$ | 8 | 0.054 | 346 | 13.56 MHz/ 250 kHz | 0.6 |
| Comparative Example 4 | 200 | 3DMAS/H2 | 133 | 0.4 | 93 | 13.56 MHz | 1.9 |
| Comparative Example 5 | 200 | 3DMAS/H2 | 400 | 0.2 | 200 | 13.56 MHz | 1.7 |

<Film Property Evaluation Method>

Film properties of the silicon nitride film produced were evaluated under the above conditions. Each evaluation method will be described below.

(Film Composition)

The interatomic bonding state of the silicon nitride film was evaluated by measuring infrared absorption spectrum using FTIR (Fourier transform infrared absorption spectrophotometer, spectrum 400 produced by Perkinelmer). Specifically, information such as Si—N bond, Si—H bond, N—H bond, C=N bond, C=C bond, Si—O bond, and so on, were collected and analyzed.

(Moisture Resistance)

The moisture resistance of the silicon nitride film was evaluated by collecting information on the Si—O bond in the film before and after the pressure cooker test (PCT) by FT-IR. The direct result obtained is the moisture absorption amount of the film. It had been separately confirmed that moisture permeation could be prevented by a silicon nitride film having a film thickness of 1 nm in terms of $SiO_2$ film when the moisture absorption amount corresponds to 1 nm of $SiO_2$ film. The film with less moisture absorption means higher moisture barrier property.

Moreover, the PCT conditions were 208 kPa and 121° C. This corresponds to an acceleration test of 10,000 times at the normal temperature and under the atmospheric pressure.

(Hydrofluoric Acid Resistance)

The hydrofluoric acid resistance of the silicon nitride film was evaluated using a BHF (buffered hydrofluoric acid) solution. Specifically, the silicon nitride film was immersed in 16 BHF (20.8% $NH_4HF_2$-containing aqueous solution, produced by Morita Chemical Industry Co., Ltd.), after a predetermined time has elapsed, the silicon nitride film was quickly rinsed with pure water and dried with nitrogen gas or the like, and the BHF etching rate R was evaluated using the following equation (1).

In the following formula (1), $d_1$ represents the film thickness before the immersion treatment, $d_2$ represents the film thickness after the immersion treatment, and t represents the immersion time. The film thickness was measured by spectroscopic ellipsometry to be described later.

$$R=(d_1-d_2)/t \quad (1)$$

(Internal Stress of Film)

The internal stress of the silicon nitride film was measured by a thin film stress measuring apparatus (FLX-2320-R, produced by Toho Technology Co., Ltd.) using the measuring principle based on the amount of warpage change of the substrate.

(Insulation Property)

The insulating property of the silicon nitride film was evaluated by mercury probe type IV measurement apparatus (SSM 495 produced by Solid State Measurement). Specifically, the insulating property was evaluated based on the leakage current value when the electric field intensity was 1 MV/cm.

(Refractive Index and Film Thickness)

The refractive index and film thickness of the silicon nitride film were measured using spectroscopic ellipsometry (GES 5 E made by SOPRA).

<Results of Film Property Evaluations>

The following Table 2 shows the evaluation results of the film properties of the silicon nitride film produced in Examples 1 to 8 and Comparative Examples 1 to 3.

In all of Examples 1 to 8, it is found that the etching rate by the hydrofluoric acid solution is 10 nm/min or lower, and the silicon nitride film of Examples 1 to 8 has higher hydrofluoric acid resistance than that of the silicon nitride film of Comparative Example 3. Further, as shown in Comparative Examples 1 and 2, it is found that sufficient hydrofluoric acid resistance cannot be obtained by using the silane gas.

Similarly, the formation rate of silicon oxide during the silicon nitride film is exposed to the saturated water vapor atmosphere at 208 kPa and 121° C. was 2 nm/hour in terms of a silicon oxide film in Examples 1 to 8. It is confirmed that the silicon nitride film of Examples 1 to 8 has the moisture resistance and the moisture barrier properties which are equal to or higher than those of the silicon nitride film of Comparative Examples 1 to 3.

In addition, as shown in Table 2, it is also found that a silicon nitride film having a very low internal stress can be produced in Examples 1 and 4. In addition, the internal stresses of Examples 1 to 8 show largely different values in a range from minus 562 MPa to plus 728 MPa, respectively. Accordingly, it is found that the internal stress of the silicon nitride film having high hydrofluoric acid resistance and high moisture resistance can be adjusted to a predetermined value.

Furthermore, it is also found that the leakage current value when applying 1 MV/cm electrolysis was $1.0 \times 10^{-6}$ $A/cm^2$ or lower and also had high insulating properties in Examples 1 to 6, and 8. In particular, it is also found that Example 1 had an excellent insulation property of $7 \times 10^{-8}$ $Å/cm^2$ or lower although it is not as good as Comparative Example using silane gas as the raw material gas.

On the other hand, in Comparative Example 4, when the flow rate ratio of the organosilane gas with respect to the hydrogen reducing gas under the production conditions of the silicon nitride film was set to 133, the formation rate of the silicon oxide during exposure to the saturated steam atmosphere at 208 kPa and 121° C. was 2.3 nm/hour in terms of the silicon oxide film, and it is found that humidity resistance and moisture barrier property are deteriorated.

Further, in Comparative Example 5, when the linear velocity under the production conditions of the silicon nitride film was set to 0.2 cm/sec, the formation rate of the silicon oxide during the exposure to the saturated water vapor atmosphere at 208 kPa and 121° C. was 29.2 nm/hour in terms of a silicon oxide film, and it is found that the moisture resistance and moisture barrier property decrease.

TABLE 2

|  | Reflective Index | 16BHF Etching Rate [nm/min] | Formation Rate of Silicon Oxide under Saturated Water Vapor Atmosphere at 208 kPa and 121° C. [nm/hour] | Internal Stress in Film [MPa] | Leakage Current at 1 MV/cm [$\times 10^{-6}$ $A/cm^2$] |
|---|---|---|---|---|---|
| Example 1 | 1.8 | 8 | 1.9 | −17 | 0.07 |
| Example 2 | 1.93 | 2.8 | 0.5 | 178 | 0.71 |
| Example 3 | 1.89 | 0.3 | 0.2 | 585 | 0.23 |

TABLE 2-continued

|  | Reflective Index | 16BHF Etching Rate [nm/min] | Formation Rate of Silicon Oxide under Saturated Water Vapor Atmosphere at 208 kPa and 121° C. [nm/hour] | Internal Stress in Film [MPa] | Leakage Current at 1 MV/cm [×10$^{-6}$ A/cm$^2$] |
|---|---|---|---|---|---|
| Example 4 | 1.89 | 0.4 | 0.5 | 2 | 0.85 |
| Example 5 | 1.92 | 0.4 | 0.8 | −188 | 0.92 |
| Example 6 | 1.92 | 2.2 | 0.6 | 109 | 0.83 |
| Example 7 | 1.93 | 0.2 | 1.2 | −562 | 3.3 |
| Example 8 | 1.87 | 7.5 | 1.1 | 728 | 0.56 |
| Comparative Example 1 | 1.91 | 161.7 | 1 | −72 | 0.01 |
| Comparative Example 2 | 1.94 | 67 | 0.5 | −65 | 0.005 |
| Comparative Example 3 | 2.04 | 12.9 | 0.5 | −166 | 0.003 |
| Comparative Example 4 | 1.91 | 0.6 | 2.3 | 135 | 0.52 |
| Comparative Example 5 | 1.82 | 9.7 | 29.2 | −30 | 0.9 |

INDUSTRIAL APPLICABILITY

The method for producing a silicon nitride film of the present invention can be used as a method for producing a mask material in the production process of a semiconductor device such as an electronic device or an optical device, a metal diffusion preventing film, an oxidation barrier film, a passivation film, an insulating film, and so on.

EXPLANATION OF REFERENCE NUMERAL 20 substrate
30 silicon nitride film
40 process chamber
41 stage
44a, 44b heater
45 showerhead gas introduction part
46a, 46b electric power source
47 vacuum pump
48 exhaust flow rate regulator
49 control unit
50 organosilane gas supply source
51 gas flow rate regulator
52 first hydrogen reducing gas supply source
53 gas flow rate regulator
54 second hydrogen reducing gas supply source
55 gas flow rate regulator
60 computer
100 plasma CVD apparatus
S insulating part
L1 gas supply line
L2 first hydrogen reducing gas supply line
L3 second hydrogen reducing gas supply line
L4 exhaust line
C1, C2, C3, C4, C5, C6, C7, C8 signal line
P1, P2 electric power supply wire

The invention claimed is:

1. A method for producing a silicon nitride film having the following film properties (a) to (c) on a substrate having a temperature of 250° C. or lower by using an organosilane gas as a raw material gas by a plasma chemical vapor deposition method,
wherein a processing gas obtained by adding a hydrogen reducing gas in a range of 200 to 2000 volumetric flow rate to an organosilane gas of 1 volumetric flow rate is used,
a pressure in a process chamber accommodating the substrate is adjusted to be in a range of 35 to 400 Pa, and
a density of high-frequency electric power applied to an electrode installed in the process chamber is adjusted to be in a range of 0.2 to 3.5 W/cm$^2$,
(a) an etching rate by a hydrofluoric acid solution is 10 nm/min or lower,
(b) a formation rate of a silicon oxide while being exposed to a saturated water vapor atmosphere at 208 kPa and 121° C. is 2 nm/hour or lower in terms of a silicon oxide film, and
(c) an internal stress in the film is in the range of −1000 to 1000 MPa,
wherein the organosilane gas is represented by a formula $(R^1R^2N)_nSiH_{4-n}$, and wherein $R^1$ and $R^2$ are each independently a hydrocarbon group and n is any one of 2, 3 and 4.

2. The method for producing a silicon nitride film according to claim 1, wherein a linear velocity of the processing gas introduced into the process chamber is adjusted to be in a range of 0.3 to 5.0 cm/sec.

3. The method for producing a silicon nitride film according to claim 1, wherein the hydrocarbon group is a methyl group or an ethyl group.

4. The method for producing a silicon nitride film according to claim 1, wherein the organosilane gas contains at least one selected from the group consisting of tetrakis(dimethylamino)silane, tris(dimethylamino)silane, bis(dimethylamino)silane, tetrakis(diethylamino)silane, tris(diethylamino)silane, bis(diethylamino)silane, tetrakis(ethylmethylamino)silane, tris(ethylmethylamino)silane, and bis(ethylmethylamino)silane.

5. The method for producing a silicon nitride film according to claim 1, wherein the hydrogen reducing gas includes a hydrogen atom.

6. The method for producing a silicon nitride film according to claim 5, wherein the hydrogen reducing gas contains at least one selected from the group consisting of ammonia, amine, and hydrocarbon.

7. The method for producing a silicon nitride film according to claim 2, wherein the hydrogen reducing gas includes a hydrogen atom.

8. The method for producing a silicon nitride film according to claim 3, wherein the hydrogen reducing gas includes a hydrogen atom.

9. The method for producing a silicon nitride film according to claim 4, wherein the hydrogen reducing gas includes a hydrogen atom.

10. A silicon nitride film having following film properties (a) to (c) which is produced by a plasma chemical vapor deposition method, wherein an organosilane gas is used as a raw material gas, a film formation temperature is adjusted to 250° C. or lower, a processing gas obtained by adding a hydrogen reducing gas in a range of 200 to 2000 volumetric flow rate with respect to the organosilane gas of 1 volumetric flow rate is used, a pressure in a process chamber accommodating a substrate is adjusted to be in a range of 35 to 400 Pa, and a density of high-frequency electric power applied to an electrode installed in the process chamber is adjusted to be in a range of 0.2 to 3.5 W/cm$^2$,
- (a) an etching rate by a hydrofluoric acid solution is 10 nm/min or lower,
- (b) a formation rate of a silicon oxide while being exposed to a saturated water vapor atmosphere at 208 kPa and 121° C. is 2 nm/hour or lower in terms of a silicon oxide film, and
- (c) an internal stress in the film is in a range of −1000 to 1000 MPa, wherein the organosilane gas is represented by a formula $(R^1R^2N)_nSiH_{4-n}$, and wherein $R^1$ and $R^2$ are each independently a hydrocarbon group and n is any one of 2, 3 and 4.

* * * * *